United States Patent [19]

Yoshida et al.

[11] Patent Number: 4,614,881
[45] Date of Patent: Sep. 30, 1986

[54] INTEGRATED SEMICONDUCTOR CIRCUIT DEVICE FOR GENERATING A SWITCHING CONTROL SIGNAL USING A FLIP-FLOP CIRCUIT INCLUDING CMOS FET'S AND FLIP-FLOP SETTING MEANS

[75] Inventors: Masanobu Yoshida, Kawaguchi; Kiyoshi Itano, Kawasaki, both of Japan

[73] Assignee: Fujitsu Limited, Kawasaki, Japan

[21] Appl. No.: 574,728

[22] Filed: Jan. 27, 1984

[30] Foreign Application Priority Data

Feb. 4, 1983 [JP] Japan .................. 58-016273

[51] Int. Cl.$^4$ ............... H03K 3/356; H03K 19/003
[52] U.S. Cl. .................................. 307/219; 307/291; 307/441; 307/469; 307/585; 365/200
[58] Field of Search ............ 365/200, 210; 371/10, 371/21; 307/441, 451, 468–469, 219, 291, 584–585

[56] References Cited

U.S. PATENT DOCUMENTS

| | | | |
|---|---|---|---|
| 4,228,528 | 10/1980 | Cenker et al. | 365/200 |
| 4,358,833 | 11/1982 | Folmsbee et al. | 365/200 |
| 4,399,372 | 8/1983 | Tanimoto et al. | 365/200 X |
| 4,446,534 | 5/1984 | Smith | 365/200 X |
| 4,459,685 | 7/1984 | Sud et al. | 365/200 |

OTHER PUBLICATIONS

"Redundancy Techniques for Fast Static RAMs", IEEE International Solid-State Circuits Conference, Kokkonen et al, Feb. 18, 1981.
"A 128K EPROM with Redundancy", Spaw et al, IEEE International Solid-State Circuits Conference, Feb. 11, 1982.
Haraszti, "Associative Control for Fault-Tolerant CMOS/SOS RAMs", 7th European Solid-State Circuits Conf., Freiburg, Germany 22-24 Sep. 1981.
Minato et al, "A Hi-CMOSII 8k×8b Static RAM", ISSCC 82, Feb. 12, 1982, Digest of Technical Papers, pp. 256-257.

Primary Examiner—Stanley D. Miller
Assistant Examiner—D. R. Hudspeth
Attorney, Agent, or Firm—Staas & Halsey

[57] ABSTRACT

An integrated semiconductor circuit device for generating a switching control signal includes a fuse having one terminal connected to a power source, and the other terminal connected to a flip-flop circuit comprising a cross-connected pair of complementary MOS field effect transistor type inverters. The output of the flip-flop circuit can be used as the switching control signal for a semiconductor memory device having a redundant circuit.

4 Claims, 6 Drawing Figures

INTEGRATED SEMICONDUCTOR CIRCUIT DEVICE FOR GENERATING A SWITCHING CONTROL SIGNAL USING A FLIP-FLOP CIRCUIT INCLUDING CMOS FET'S AND FLIP-FLOP SETTING MEANS

BACKGROUND OF THE INVENITON

1. Field of the Invention

The present invention relates to an integrated semiconductor circuit device, more particularly, it relates to an integrated semiconductor device for generating a switching control signal. The device, according to the present invention, can be used for a semiconductor memory device with a redundant circuit, such as, for example, an erasable programmable read only memory (EPROM).

2. Description of the Prior Art

In order to enhance the yield of semiconductor memory chips with a large memory capacity, these chips are produced with a structure having a redundant circuit.

For example, in a read only memory having eight parallel outputs, memory cell arrays for nine bits including one redundant memory cell array are provided. The first through the eighth memory cell arrays are the regular memory cell arrays, while the ninth memory cell array is the redundant memory cell array.

When a failure occurs in any of the regular memory cell arrays, the ninth memory cell array is connected in place of the failed regular memory cell array, so that the normal operation of the device is maintained. This switching of the connection from the regular memory cell array to the redundant memory cell array is carried out by a switching control signal generation circuit. The function of this circuit is to decide whether a fuse should be in a conductive or nonconductive state.

The output of such a prior art switching control signal generation circuit is sent to a switching circuit, and the switching from a failed memory cell array to the redundant memory cell array is made by blowing the fuse.

However, in this prior art circuit the current flows through a pull-down resistor when the fuse is not blown, and the power consumption due to this current in the pull-down resistor is wasteful and causes other problems.

That is, the peripheral circuits formed by complementary MOS field effect transistors around a semiconductor memory device have the advantage of a lower power consumption. For example, the current in the peripheral circuits can be reduced to the order of $10^{-9}$ A. However, in this prior art circuit, the current flowing through the pull-down resistor tends to be increased to the order of $10^{-6}$ A, and may reach up to $50 \times 10^{-6}$ A. If such a current flows in the circuit, the advantage of using complementary MOS field effect transistors will be lost, and the advantage of using a redundant circuit cannot be fully appreciated.

SUMMARY OF THE INVENTION

An object of the present invention is to provide an improved semiconductor memory device with a redundant circuit in which the current flowing through the switching control signal generation circuit for the redundant circuit is reduced, and the power consumption in the switching control signal generation circuit for the redundant circuit is also reduced, maintaining the advantage of the use of complementary MOS field effect transistors.

In accordance with the present invention there is provided an integrated semiconductor circuit device for generating a switching control signal including a flip-flop circuit including a cross-connected pair of complementary MOS field effect transistor type inverters, and a fuse having one terminal connected to a power source and another terminal connected to the flip-flop circuit. The flip-flop circuit generates a switching control signal corresponding to a conductive or nonconductive state of the fuse.

DESCRIPTION OF THE PREFERRED EMBODIMENTS

Before describing the preferred embodiments of the present invention, it is necessary to give a more detailed description of a prior art switching control generation circuit and the problems arising therein in order to better explain the advantages of the present invention over the prior art.

Figure 1:
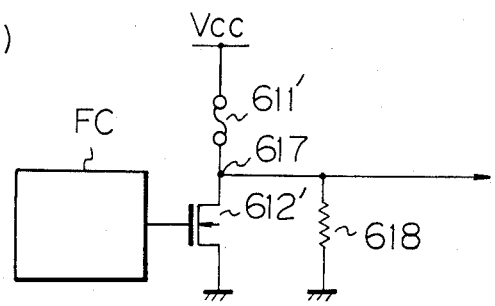
FIG. 1 is a cricuit diagram of a prior art switching control signal generation circuit for a redundant circuit.

An example of a prior art switching control signal generation circuit is shown in FIG. 1. The circuit shown in FIG. 1 includes a fuse 611', a fuse blowing control circuit FC, an N-channel field effect transistor 612', and a pull-down resistor 618.

One terminal of the fuse 611' is connected to the voltage source $V_{cc}$, while the other terminal is connected to the drain of an N-channel field effect transistor 612' and one terminal of the pull-down resistor 618. The output of the fuse blowing control circuit FC is supplied to the gate of the transistor 612'. The source of the transistor 612' is grounded, and the output of the switching control signal generation circuit is produced from the junction 617 of the fuse 611' and the transistor 612'.

The fuse 611', made of polycrystalline silicon, is blown when the N-channel field effect transistor 612' becomes ON. Hence, when the fuse 611' is not blown, the voltage of the junction 617 is equal to $V_{cc}$, while when the fuse 611' is blown, the voltage of the junction 617 is that of ground.

The output of the switching control signal generation circuit shown in FIG. 1 is used for controlling the switching to the redundant memory cell array in such a manner that the blowing of the fuse 611' causes the switching from a failure memory cell array to the redundant memory cell array.

In the circuit shown in FIG. 1, however, the current flows through the pull-down resistor 618 when the fuse 611' is not blown, and the power consumption due to the current in the pull-down resistor 618 is wasteful and causes other problems.

That is, the peripheral circuits formed by complementary MOS field effect transistors used around a semiconductor memory device have the advantage of a lower power consumption. For example, the current in the peripheral circuits can be reduced to the order of $10^{-9}$ A. However, in the circuit shown in FIG. 1, the current flowing through the pull-down resistor 618 tends to be increased to the order of $10^{-6}$ A, and may reach up to $50 \times 10^{-6}$ A. If a large current flows in the circuit, the advantage of using complementary MOS field effect transistors will be lost, and at the same time, the advantage of using the redundant circuit cannot be appreciated.

Figure 2:
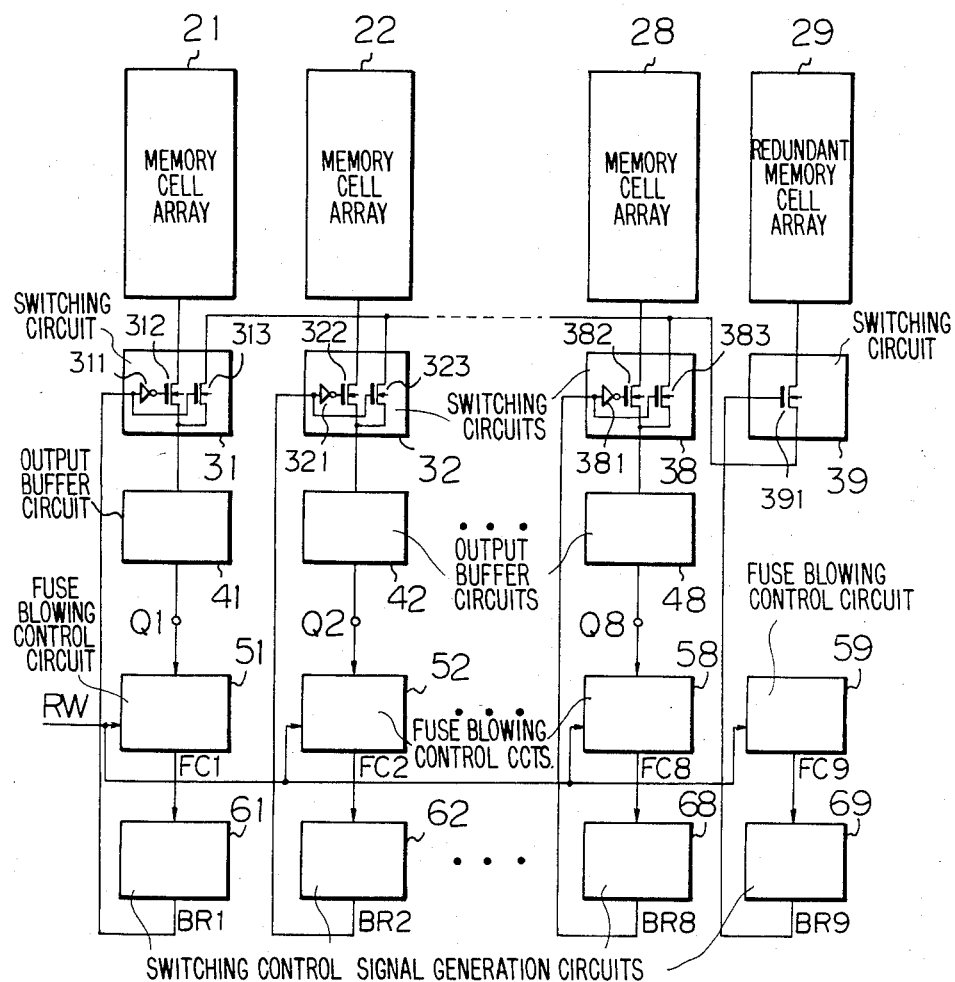
FIG. 2 is a schematic diagram of a semiconductor memory device having a redundant circuit according to an embodiment of the present invention.

The semiconductor memory device having a redundant circuit according to an embodiment of the present invention is illustrated in FIG. 2. The semiconductor memory device shown in FIG. 2 is an erasable programmable read only memory (EPROM) type. This device is provided with eight regular memory cell arrays 21, 22, . . . 28 and one redundant memory cell array 29. The device is also provided with switching circuits 31, 32, . . . 38 corresponding to the regular memory cell arrays 21, 22, . . . 28, a switching circuit 39 corresponding to the redundant memory cell array 29, and output buffer circuits 41, 42, . . . 48 corresponding to the switching circuits 31, 32, . . . 38. Eight bit data Q1, Q2, . . . Q8, from an address of the memory cell arrays, are obtained at output terminals of the output buffer circuits 41, 42, . . . 48. The output terminals of the output buffer circuits 41, 42, . . . 48 are connected to the Q1, Q2, Q8 input terminals of the fuse blowing control circuits 51, 52, . . . 58.

The output terminals of the fuse blowing control circuits 51, 52, . . . 58 are connected to the FC1, FC2, . . . FC8 input terminals of the switching control signal generation circuits 61, 62, . . . 68. The output terminal of the fuse blowing control circuit 59 is connected to the FC9 input terminal of the switching control signal generation circuit 69.

The output of the redundant memory cell array 29 is adapted to be connected to the switching circuits 31, 32, . . . 38 corresponding to the regular memory cell arrays, via the switching circuit 39 corresponding to the redundant memory cell array. Each of the switching circuits 31, 32, . . . 38 includes an inverter (311, 321, . . . 381), a first field effect transistor (312, 322, . . . 382), and a second field effect transistor (313, 323, . . . 383). The switching circuit 39 includes a field effect transistor 391.

The switching control signals BR1, BR2, . . . BR8, produced from switching control signal generation circuits 61, 62, . . . 68, are supplied to the switching circuits 31, 32, . . . 38, while the switching control signal BR9 produced from a switching control signal generation circuit 69 is supplied to the switching circuit 39.

Usually the potentials of the switching signals BR1, BR2, . . . BR9 are LOW, and hence the outputs of the regular memory cell arrays 21, 22, . . . 28 are supplied through the switching circuits 31, 32, . . . 38 to the output buffer circuits 41, 42, . . . 48.

The replacement of the output of a selected regular memory cell array, for example, 21, by the output of the redundant memory cell array 29 is carried out as follows.

The replacement is selected by making the potential of the redundant control signal RW, supplied to the fuse blowing control circuits 51, 52, . . . 59, to be HIGH, and making the potential of the Q1 input of the fuse blowing control circuit 51 to be LOW, by an external means.

According to the above-described instruction, the potential of the FC1 output signal from the fuse blowing control circuit 51 becomes HIGH, and the potential of the FC9 output signal from the fuse blowing control circuit 59 also becomes HIGH. When a HIGH FC1 signal is supplied to the switching control signal generation circuit 61 and a HIGH FC9 signal is supplied to the switching control signal generation circuit 69, the fuses in the switching control signal generation circuits 61 and 69 are blown, and hence both potentials of the output signals BR1 and BR9 of the switching control signal generation circuits 61 and 69 become HIGH. Accordingly, the output of the redundant memory cell array 29 is supplied via the switching circuit 39 and 30 the switching circuit 31 to the output buffer circuit 41, while the outputs of the regular memory cell arrays 22, . . . 28 are supplied via the switching circuits 32, . . . 38 to the output buffer circuits 42, . . . 48. Thus, the replacement of the output of the regular memory cell array 21 by the output of the redundant memory cell array 29 is achieved.

Figure 3:
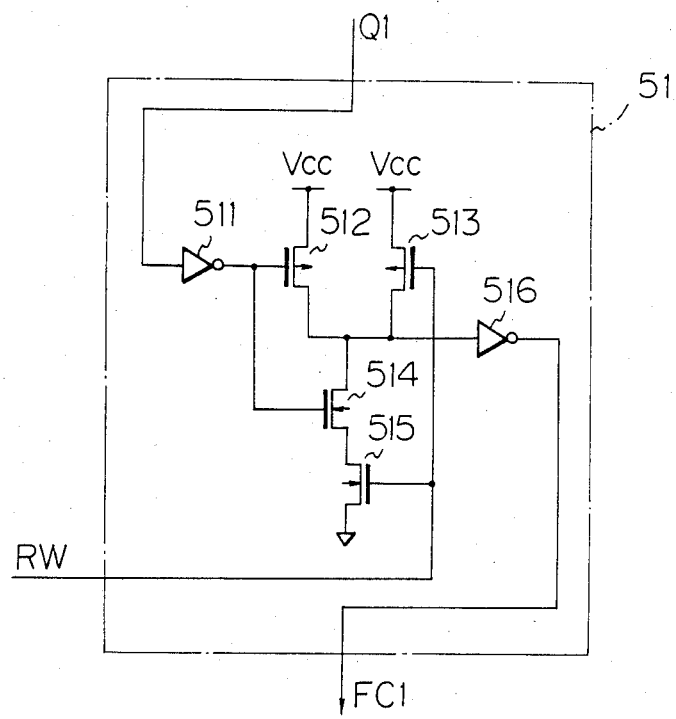
FIGS. 3 and 4 are circuit diagrams of the fuse blowing control circuits used in the device shown in FIG. 2.
Figure 4:
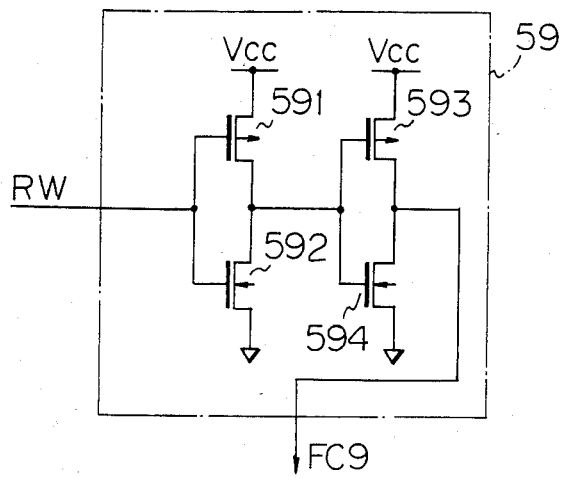

The fuse blowing control circuits 51, 52, . . . 58 have the same structure; for example, the structure of the fuse blowing control circuit 51 illustrated in FIG. 3. The structure of the fuse blowing control circuit 59 is illustrated in FIG. 4.

The fuse blowing control circuit 51 includes an inverter 511, field effect transistors 512, 513, 514, and 515, and an inverter 516. The fuse melting control circuit 59 includes a waveform shaper consisting of two inverters formed by field effect transistors 591, 592, 593, and 594.

As described before, if the potential of the input signal Q1 is made LOW and the potential of the redundant control signal RW is made HIGH, the fuse blowing control circuit 51 produces a HIGH FC1 output signal. If the potential of the redundant control signal RW is made HIGH, the fuse blowing control circuit 59 produces a HIGH FC9 output signal.

Figure 5:
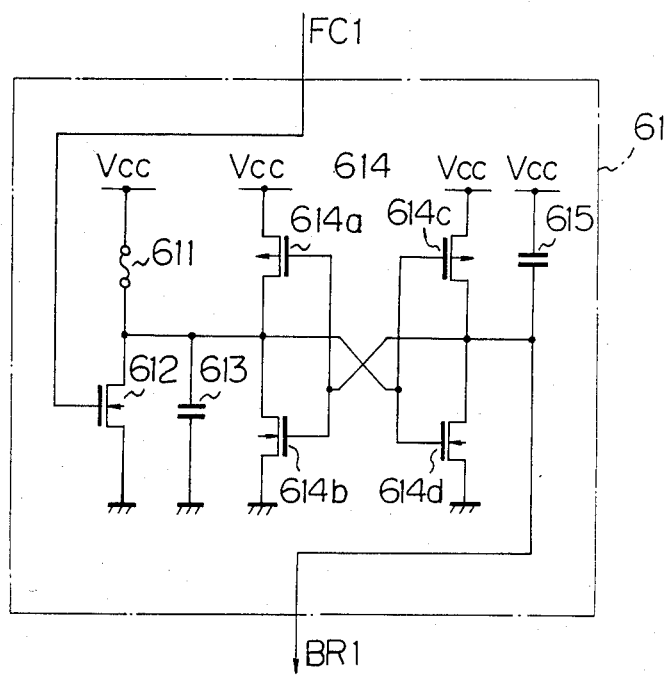
FIG. 5 is a circuit diagram of the switching control signal generation circuit used in the device shown in FIG. 2.

The switching control signal generation circuits 61, 62, . . . 69 have the same structure; for example, the structure of the switching control signal generation circuit 61 illustrated in FIG. 5.

The switching control signal generation circuit 61 includes a fuse 611, a field effect transistor 612, a capacitor 613, a flip-flop unit 614 including two complementary MOS field effect transistor type inverters formed by MOS field effect transistors 614a, 614b, 614c, and 614d, and a capacitor 615. When the fuse 611 is not blown the potential of the output signal BR1 is LOW, while when the fuse 611 is blown the potential of the output signal BR1 is HIGH. The capacitors 613 and 615 are provided for ensuring the HIGH potential of the output signal BR1 when the power source is switched on where the fuse 611 is blown. It is desirable to select the conductance of the field effect transistor 614a to be small in order to further ensure the HIGH potential of the output signal BR1 when the power source is switched on when the fuse 611 is blown. In order to further ensure the HIGH potential of the output signal BR1 when the power source is switched on when the fuse 611 is blown, it is even more desirable to use a P channel MOS field effect transistor 614a having a small $g_m$.

Note, in the present invention, no current flows in the switching control signal generation circuit 61 during the steady state, contrary to the case of the prior art circuit shown in FIG. 1.

Although the preferred embodiment has been described heretofore, various modifications and alterations are possible without departing from the scope of the present invention. For example, instead of the fuse blowing control circuit 51, it is possible to provide a terminal pad connected to the lower terminal of the fuse 611 in the switching control signal generation circuit 61. The application of a predetermined positive or negative potential, or the application of ground potential to the terminal pad will cause the fuse to blow.

As another example, it is possible to use laser radiation instead of an electric signal for blowing the fuse.

Figure 6:
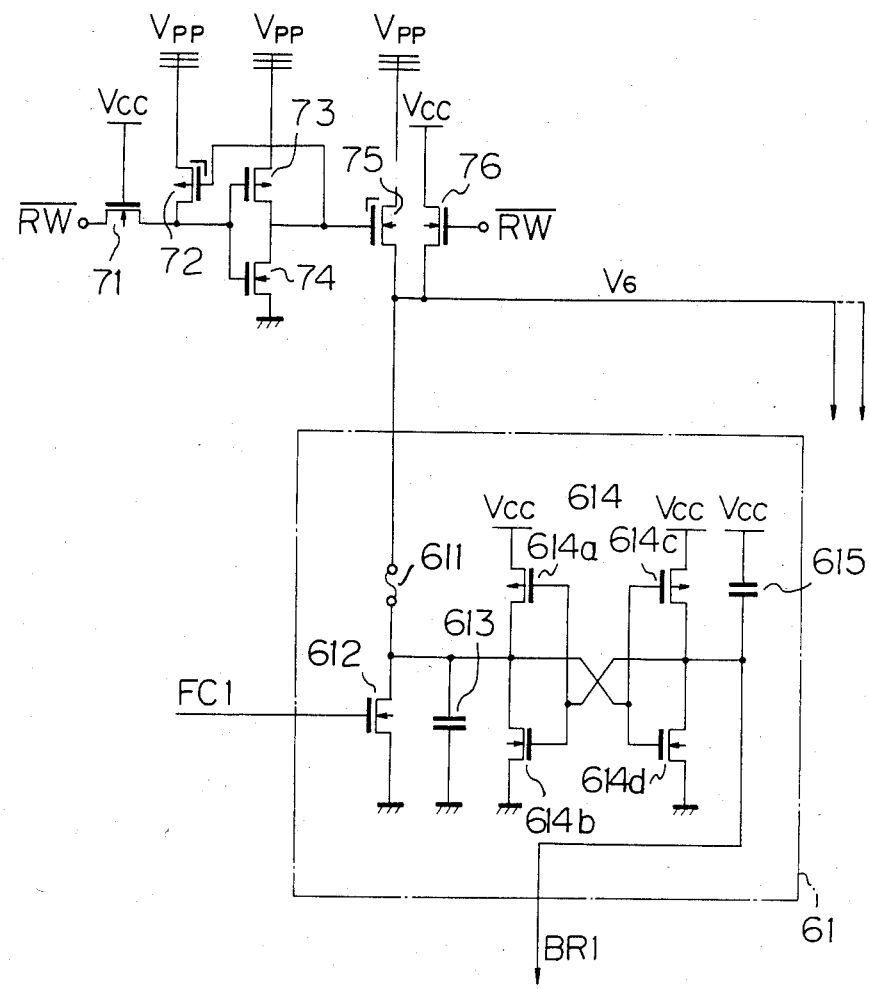
FIG. 6 is another circuit diagram of a circuit for blowing the fuse.

As yet another example, instead of the use of a power source having a relatively low voltage $V_{cc}$ of, for example, 5 V, for melting the fuse, it is also possible to use an additional power source having a relatively high voltage $V_{pp}$ of, for example, 21 V, as shown in FIG. 6. In the circuit shown in FIG. 6, the transistors 72 and 75, expressed by the transistor symbol having an angle mark, have a high withstand voltage. During the period in which the potential of the signal $\overline{RW}$ for blowing the fuse is LOW, the transistor 76 is in the OFF state. Also, the potential of the output of the inverter comprising of the transistors 73 and 74 becomes HIGH. Hence, the transistor 75 becomes conductive, and accordingly, the voltage $V_6$ becomes equal to $V_{pp}$. Thus, the blowing of the fuse is easily carried out when the potential of the signal FC1 is made HIGH.

In the circuit shown in FIG. 6, the potential of the signal $\overline{RW}$ is usually HIGH. Therefore, the transistor 76 becomes conductive, and the potential of the transistors 73 and 74 becomes LOW. Hence, the transistor 75 enters the OFF state, and the transistor 76 enters the ON state. Accordingly, the voltage $V_6$ becomes equal to $V_{cc}$. The operation of the circuit 61 is the same as the circuit of FIG. 4.

Further, the present invention is applicable not only to an EPROM, but also to an integrated circuit for a random access memory, an integrated circuit for a logic circuit, or the like.

We claim:

1. An integrated semiconductor circuit device, operatively connected to receive input signals and a redundant control signal, including a memory device, said memory device comprising:
   a switching device, said switching device including:
      a flip-flop circuit comprising a cross-connected pair of complementary MOS field effect transistor type inverters;
      a fuse having one terminal operatively connected to a power source and having the other terminal operatively connected to said flip-flop circuit;
      said flip-flop circuit generating a switching control signal corresponding to a blown or unblown state of said fuse;
   integrated semiconductor circuits;
   a redundant integrated semiconductor circuit;
   first switching circuits, respectively, operatively connected to said integrated semiconductor circuits and to said redundant integrated semiconductor circuit, for providing selective replacement of one one of said integrated semiconductor circuits with said redundant integrated semiconductor circuit in accordance with the switching control signal;
   a second switching circuit operatively connected between said redundant integrated semiconductor circuit and said first switching circuits;
   output buffer circuits, respectively, operatively connected to said first switching circuits; and
   fuse blowing control, respectively, operatively connected to said integrated semiconductor circuits and said redundant integrated semiconductor circuit, for generating fuse blowing control signals in accordance with the input signals and the redundant control signal.

2. An integrated semiconductor circuit device, operatively connectable to a power source, for a switching control signal generation circuit generating a switching control signal, said switching control signal generation circuit comprising:
   a fuse having a first terminal operatively connected to the power source and having a second terminal; and
   a flip-flop circuit, operatively connected to said second terminal of said fuse, for generating the switching control signal which indicates a blown or unblown state of said fuse, said flip-flop circuit including a pair of complementary MOS fuekd effect transistor type inverters cross connected to each other.

3. A semiconductor integrated memory device, operatively connected to receive input signals and a redundant control signal, comprising:
   a redundant integrated semiconductor circuit;
   regular integrated semiconductor circuits, operatively connected to said redundant integrated semiconductor circuit;
   switching control signal generation circuits; each comprising:
      a flip-flop circuit including a cross-connected pair of complementary MOS field-effect transistor type inverters, for generating a switching control signal; and
      a fuse having one terminal operatively connectable to a power-source and having the other terminal operatively connected to said flip-flop circuit, said switching control signal corresponding to a blown or unblown state of said fuse;
   first switching circuits, respectively, operatively connected to said regular integrated semiconductor circuits and said switching control signal generation circuits, for providing selective replacement of one of said regular integrated semiconductor circuits with said redundant integrated semiconductor circuit in accordance with the switching control signal;
   a second switching circuit operatively connected between said redundant integrated semiconductor circuit and said first switching circuits;
   output buffer circuits, respectively, operatively connected to said first switching circuits connected to said regular integrated semiconductor circuits; and
   fuse blowing control circuits, respectively, operatively connected to said regular and redundant integrated semiconductor circuits, for generating fuse blowing control signals in accordance with the input signals and the redundant control signal.

4. An integrated semiconductor circuit device for generating a switching control signal, comprising:
   first and second power supply means for supplying a power source voltage;
   flip-flop circuit means including a cross-connected pair of complementary MOS field effect transistor type inverters, each of said inverters comprising P-channel type and N-channel type MOS transistors connected in series between said first and second power supply means to form a common connection node which is an output node of one of said inverters, each of said P-channel transistors of one of said inverters having commonly connected gates connected to said common connection node of one of the other of said inverters, said flip-flop circuit means producing a first or second state while said power source voltage is applied;

a fuse having a first terminal operatively connected to one of said first and second power supply means and having a second terminal terminal, operatively connected to said flip-flop circuit means, for setting said flip-flop circuit means to the first state when said fuse is in an unblown state; and flip-flop setting means, operatively connected to at least one of said common connection nodes of said inverters, for setting said flip-flop circuit means to the second state when said power source voltage is applied and said fuse is in a blown state;

said flip-flop circuit means generating the switching control signal corresponding to the blown or unblown state of said fuse.

* * * * *

UNITED STATES PATENT AND TRADEMARK OFFICE
CERTIFICATE OF CORRECTION

PATENT NO. : 4,614,881
DATED      : SEPTEMBER 30, 1986
INVENTOR(S) : MASANOBU YOSHIDA ET AL.

It is certified that error appears in the above-identified patent and that said Letters Patent is hereby corrected as shown below:

Col. 2, line 34, after "therein" insert --,--.

Col. 4, line 14, delete "30";
        line 55, "where" should be --when--.

Col. 5, line 23, "comprising of" should be --comprising--;
        line 63, delete "one".

Col. 6, line 3, after "control" insert --circuits--;
        line 21, "fuekd" should be --field--.

Col. 7, line 6, after "P-channel" insert --and N-channel--.

Signed and Sealed this

Thirteenth Day of January, 1987

Attest:

DONALD J. QUIGG

*Attesting Officer*      *Commissioner of Patents and Trademarks*